(12) United States Patent
Streck et al.

(10) Patent No.: US 7,638,428 B2
(45) Date of Patent: Dec. 29, 2009

(54) SEMICONDUCTOR STRUCTURE AND METHOD OF FORMING THE SAME

(75) Inventors: Christof Streck, Coswig (DE); Volker Kahlert, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 195 days.

(21) Appl. No.: 11/776,155

(22) Filed: Jul. 11, 2007

(65) Prior Publication Data

US 2008/0128912 A1 Jun. 5, 2008

(30) Foreign Application Priority Data

Nov. 30, 2006 (DE) .................. 10 2006 056 620

(51) Int. Cl.
*H01L 21/4763* (2006.01)
(52) U.S. Cl. .................. 438/651; 438/630; 438/650; 257/755; 257/762; 257/E23.162
(58) Field of Classification Search .............. 438/629, 438/630, 650, 651; 257/383, 384, 413, 755, 257/757, 768, E23.157, E21.439, E21.593
See application file for complete search history.

(56) References Cited

U.S. PATENT DOCUMENTS

| 5,656,542 A | 8/1997 | Miyata et al. | 438/645 |
|---|---|---|---|
| 6,016,012 A | 1/2000 | Chatila et al. | 257/775 |
| 6,624,513 B1 | 9/2003 | Iwasaki et al. | 257/753 |
| 2003/0111729 A1 | 6/2003 | Leu et al. | 257/758 |
| 2004/0248409 A1 | 12/2004 | Padhi et al. | 438/653 |
| 2006/0030143 A1* | 2/2006 | Ivanov | 438/622 |
| 2007/0108616 A1* | 5/2007 | Nakagawa et al. | 257/751 |
| 2007/0148952 A1* | 6/2007 | O'Brien et al. | 438/618 |

FOREIGN PATENT DOCUMENTS

| DE | 43 09 542 C2 | 10/1997 |
|---|---|---|
| EP | 0 226 385 A1 | 2/1986 |
| FR | 2 782 839 | 3/1999 |
| WO | WO 2006/020565 A2 | 2/2006 |

OTHER PUBLICATIONS

Wolf and Tauber, Silicon Processing for the VLSI Era, vol. 1—Process Technology, 2nd Edition, 10.3.4 Electrical Activation and Implantation Damage Annealing and 15.5 Chemical Mechanical Polishing, 2000, pp. 393-398 and 742-744.*
Translation of Official Communication from German Patent Office for German Patent Application No. 10 2006 056 620.3-33 dated Jul. 26, 2007.

(Continued)

*Primary Examiner*—David Vu
*Assistant Examiner*—Earl N Taylor
(74) *Attorney, Agent, or Firm*—Williams, Morgan & Amerson, P.C.

(57) ABSTRACT

A method of forming a semiconductor structure comprises providing a semiconductor substrate comprising a layer of a dielectric material. A recess is provided in the layer of dielectric material. The recess is filled with a material comprising silver.

23 Claims, 5 Drawing Sheets

OTHER PUBLICATIONS

Bhagat et al., "Tungsten-titanium diffusion barriers for silver metallization," *Thin Solid Films,* 515:1998-2002, 2006.

Kessler and Winogradoff, "Improved Ohmic Contacts for Semi-Conductive Devices," IBM Technical Disclosure Bulletin, vol. 7, p. 166, 1964.

Translation of official action from German Patent Application No. 10 2006 056 620.3 dated Oct. 28, 2008.

PCT Search Report and Written Opinion from PCT/US2007/024564 dated Apr. 1, 2008.

* cited by examiner

SEMICONDUCTOR STRUCTURE AND METHOD OF FORMING THE SAME

BACKGROUND OF THE INVENTION

1. Field of the Invention

The present disclosure generally relates to the fabrication of integrated circuits, and, more particularly, to the formation of electrically conductive features connecting circuit elements in integrated circuits.

2. Description of the Related Art

Integrated circuits comprise a large number of individual circuit elements, such as transistors, capacitors and resistors. These elements are connected by means of electrically conductive features to form complex circuits, such as memory devices, logic devices and microprocessors. The performance of integrated circuits can be improved by increasing the number of functional elements per circuit in order to increase the circuit's functionality and/or by increasing the speed of operation of the circuit elements. A reduction of feature sizes allows the formation of a greater number of circuit elements on the same area, hence increasing the functionality of the circuit, and also reducing signal propagation delays, thus making an increase of the speed of operation of circuit elements possible.

As feature sizes in integrated circuits are reduced, sophisticated techniques are required in order to electrically connect the circuit elements of the integrated circuits. If a greater number of circuit elements is formed on the same area, it may be necessary to reduce the dimensions of the electrically conductive features in order to accommodate the electrically conductive features. Additionally, electrically conductive features may be formed in a plurality of levels stacked on top of each other.

In modern integrated circuits, electrically conductive features in higher interconnect levels are frequently made of copper. If, however, copper diffuses into a silicon substrate wherein circuit elements are formed and is incorporated into the crystal lattice of the silicon substrate, deep impurity levels may be created. Such deep impurity levels may lead to a degradation of the performance of circuit elements such as field effect transistors. In order to avoid such problems, electrical connections between circuit elements and the first level of electrically conductive lines are frequently made of tungsten.

Figure 1A:
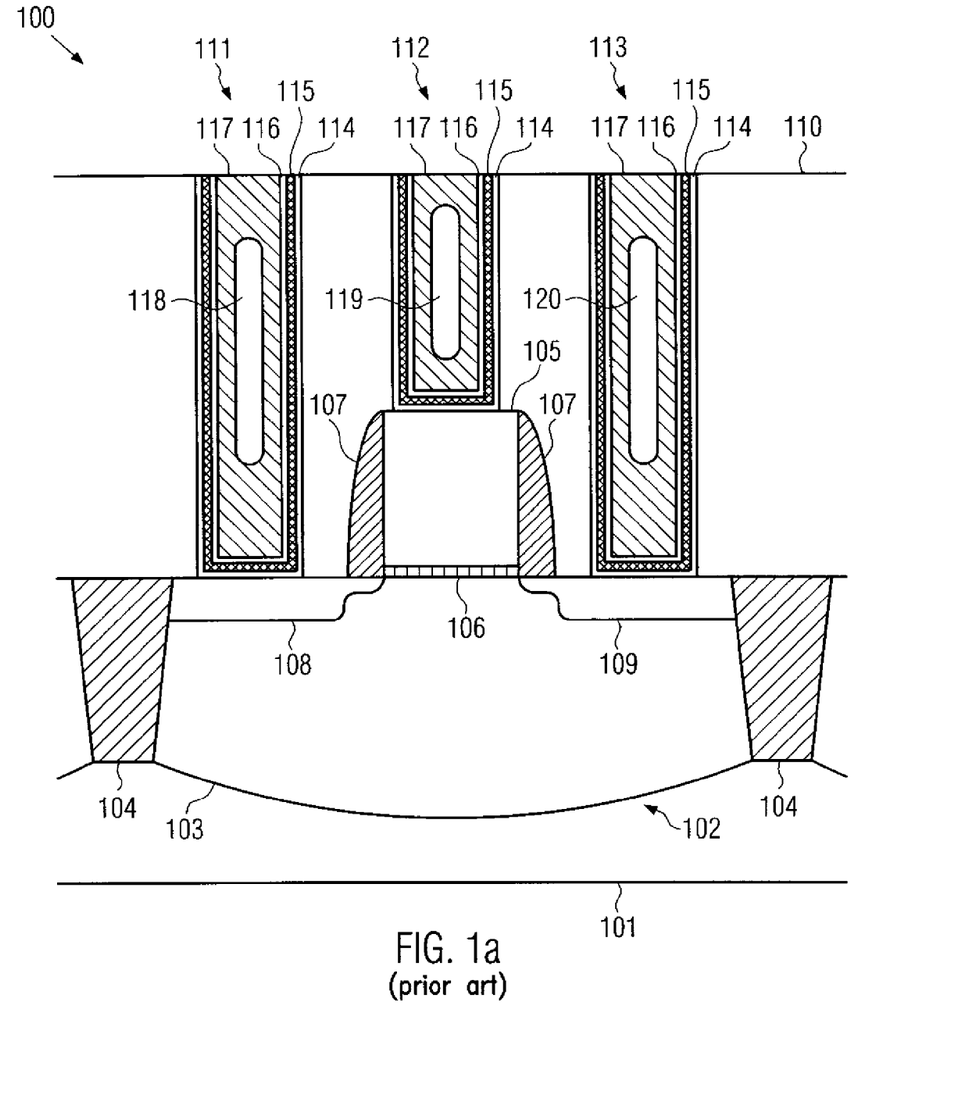
FIGS. 1a-1b show schematic cross-sectional views of a semiconductor structure in stages of a method of manufacturing a semiconductor structure according to the state of the art.

A method of forming a semiconductor structure according to the state of the art will be described with reference to FIGS. 1a-1b. FIG. 1a shows a schematic cross-sectional view of a semiconductor structure 100 in a first stage of a manufacturing method according to the state of the art.

The semiconductor structure 100 comprises a substrate 101. The substrate 101, which may, for example, comprise silicon, comprises a field effect transistor 102. The field effect transistor 102 comprises an active region 103, a source region 108 and a drain region 109. In examples of manufacturing methods according to the state of the art wherein the field effect transistor 102 is an N-type transistor, the material of the substrate 101 may be P-doped and the source region 108 and the drain region 109 may be N-doped. Conversely, in examples of manufacturing methods according to the state of the art wherein the field effect transistor 102 is a P-type transistor, the active region 103 may be N-doped and the source region 108 as well as the drain region 109 may be P-doped. Thus, a PN transition is provided at an interface between the source region 108 and the active region 103 and at an interface between the drain region 109 and the active region 103.

The field effect transistor 102 further comprises a gate electrode 105 flanked by a sidewall spacer structure 107 and separated from the active region 103 by a gate insulation layer 106. A trench isolation structure 104 provides electrical insulation between the field effect transistor 102 and other circuit elements in the semiconductor structure 100. The field effect transistor 102 may be formed by means of methods well known to persons skilled in the art, including advanced techniques of ion implantation, deposition, photolithography, etching, oxidation and annealing.

A layer 110 of a dielectric material is deposited over the substrate 101. The layer 110 may comprise silicon dioxide, silicon nitride and/or silicon oxynitride and may be formed by means of known deposition techniques, such as chemical vapor deposition (CVD) and plasma enhanced chemical vapor deposition (PECVD). A thickness of the layer 110 may be greater than a height of the gate electrode 105. After the deposition of the layer 110, a known planarization process, such as chemical mechanical polishing (CMP), may be performed to obtain a planar surface of the layer 110.

Contact vias 111, 112, 113 are formed in the layer 110. To this end, a mask (not shown) covering the layer 110 with the exception of those portions wherein the contact vias 111, 112, 113 are to be formed is formed over the semiconductor structure 100 by means of known methods of photolithography. Thereafter, a known anisotropic etching process, for example, a dry etching process, is performed to remove those portions of the layer 110 which are not covered by the mask. The anisotropy of the etching process may help in obtaining substantially vertical sidewalls of the contact vias 111, 112, 113.

The contact via 111 is formed over the source region 108. Thus, at the bottom of the contact via 111, a portion of the source region 108 is exposed. The contact vias 112, 113 are formed over the gate electrode 105 and the drain region 109, respectively. Hence, the gate electrode 105 is exposed at the bottom of the contact via 112 and the drain region 109 is exposed at the bottom of the contact via 113.

In some examples of manufacturing methods according to the state of the art, an etch stop layer (not shown) comprising a material which is etched at a significantly lower etch rate than the dielectric material of the layer 110 may be provided between the field effect transistor 102 and the layer 110. Thus, the etch process may be reliably stopped as soon as the vias 111, 112, 113 penetrate the layer 110 of dielectric material. After the formation of the contact vias 111, 112, 113, a second etching process may be performed in order to remove portions of the etch stop layer exposed at the bottom of the contact vias 111, 112, 113. After the formation of the contact vias 111, 112, 113, the mask may be removed, for example by means of a known resist strip process.

Subsequently, the contact vias 111, 112, 113 are filled with tungsten. To this end, a first glue layer 114 and a second glue layer 115 are deposited over the semiconductor structure 100. The glue layers 114, 115 may improve adhesion between the tungsten provided in the contact vias 111, 112, 113 and the dielectric material of the layer 110. Additionally, the glue layers 114, 115 may help in obtaining a more favorable crystalline structure of the tungsten if the tungsten is deposited by means of a CVD process and/or a PECVD process.

The first glue layer 114 may comprise titanium and may be formed by means of an ionized metal plasma deposition process. As persons skilled in the art know, ionized metal plasma deposition is a variant of physical vapor deposition wherein metal atoms. which may, for example, be created by sputtering a target comprising the metal to be deposited, are ionized in a plasma. The plasma may be created by means of an electric glow discharge in a carrier gas, which may, for example, comprise nitrogen and/or a noble gas. The electric glow discharge may be created by inductively coupling a radio frequency alternating current to the carrier gas and/or by applying the radio frequency alternating voltage to electrodes provided in the carrier gas. The ionized metal atoms are then accelerated towards the substrate 101 by means of a bias voltage applied between the substrate 101 and an electrode provided with a reactor vessel wherein the ionized metal plasma deposition is performed. The second glue layer 115 may comprise titanium nitride and may be formed by means of a CVD process and/or a PECVD process well known to persons skilled in the art.

A seed layer 116 comprising tungsten is formed over the semiconductor structure 100. The seed layer 116 may be formed by means of an atomic layer deposition (ALD) process. As persons skilled in the art know, ALD is a variant of CVD wherein the semiconductor structure is sequentially exposed to a plurality of gaseous precursor compounds which are sequentially flown to a reactor vessel wherein the semiconductor structure 100 is provided. While a first precursor is flown to the semiconductor structure 100, a substantially monoatomic layer of the first precursor is formed over the second glue layer 115. Since adhesion between molecules of the first precursor may be weak, deposition of more than one monoatomic layer of the first precursor may be substantially avoided by adapting the temperature of the ALD process. Thereafter, a second precursor is flown to the semiconductor structure 100. The second precursor reacts chemically with the first precursor present on the surface of the semiconductor structure 100. In the chemical reaction, tungsten may be created.

After the formation of the seed layer 116, a layer 117 comprising tungsten may be formed over the seed layer 116. To this end, well-known deposition techniques such as CVD and/or PECVD may be employed. In the formation of the layer 117, material deposition in the vicinity of the edges of the contact vias 111, 112, 113 may proceed faster than material deposition in the vicinity of the bottom of the contact vias 111, 112, 113. Therefore, seams 118, 119, 120 may be formed inside the contact vias 111, 112, 113.

Subsequently, a CMP process adapted to remove portions of the glue layers 114, 115, the seed layer 116 and the layer 117 comprising tungsten deposited outside the contact vias 111, 112, 113 may be performed.

Figure 1B:
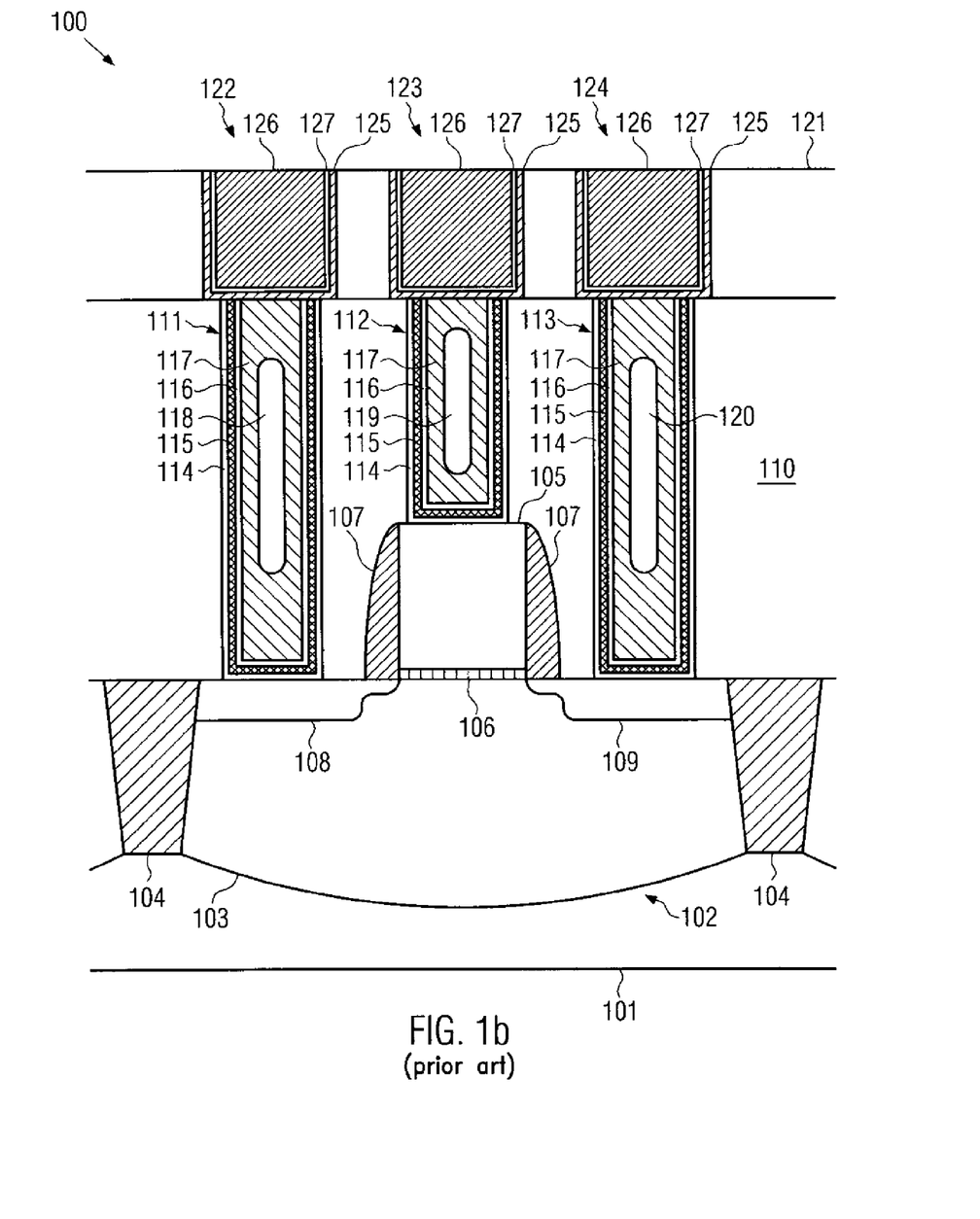

FIG. 1b shows a schematic cross-sectional view of the semiconductor structure 100 in a later stage of the manufacturing process according to the state of the art. A second layer 121 of a dielectric material is formed over the first layer 110 of dielectric material. In some examples of manufacturing processes according to the state of the art, the second layer 121 may comprise the same material as the first dielectric layer 110. Alternatively, the second layer 121 may comprise a different material than the first dielectric layer 110, for example, a low-k material such as hydrogen silsesquioxane.

In the second layer 121 of dielectric material, trenches 122, 123, 124 are formed. This may be done by means of techniques of photolithography and etching well known to persons skilled in the art.

A barrier layer 125 is formed over the semiconductor structure 100. The barrier layer 125 may comprise tantalum and/or tantalum nitride and may be adapted to prevent a diffusion of copper which will be provided in the trenches 122, 123, 124 into other portions of the semiconductor structure 100.

Subsequently, a seed layer 127 comprising copper is formed over the semiconductor structure 100. This may be done by means of well-known methods such as CVD or PECVD. Thereafter, a layer 126 comprising copper is formed over the seed layer 127, for example, by means of an electroplating process well known to persons skilled in the art. Finally, portions of the seed layer 127 and the layer 206 outside the trenches 122, 123, 124 are removed, for example, by means of a chemical mechanical polishing process.

A problem of the above-described manufacturing process according to the state of the art is that tungsten, which is used for filling the contact vias 111, 112, 113, has a relatively high resistivity. Thus, as the size of the contact vias 111, 112, 113, in particular a diameter thereof, is reduced, electrical currents flowing through the contact vias 111, 112, 113 may be subject to a high resistance, which may lead to an increase of signal propagation delays as well as to an undesirable creation of heat. The electric resistance of the contact vias 111, 112, 113 filled with tungsten may further be increased by the presence of the seams 118, 119, 120. Additionally, the glue layers 114, 115 may have an even higher resistivity than tungsten. Thus, the presence of the glue layers 114, 115 may further contribute to the increase of the electrical resistance of the contact vias 111, 112, 113.

A further problem of the above-described manufacturing process according to the state of the art is that it may occur that one or more of the seams 118, 119, 120 are opened during the CMP process which is performed to remove portions of the glue layers 114, 115, the seed layer 116 and the layer 117 outside the contact vias 111, 112, 113. This may lead to a significant reduction of the electrical conductivity of the contact vias 111, 112, 113 filled with tungsten or even to a failure of the semiconductor structure 100.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative embodiment disclosed herein, a method of forming a semiconductor structure comprises providing a semiconductor substrate comprising a layer of a dielectric material, a recess being provided in the layer of dielectric material. The recess is filled with a material comprising silver.

According to another illustrative embodiment disclosed herein, a semiconductor structure comprises a semiconductor substrate. The semiconductor substrate comprises a layer of a dielectric material. A recess is provided in the layer of dielectric material. The recess is filled with a material comprising silver.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In some embodiments disclosed herein, a recess formed in a layer of dielectric material provided over a semiconductor substrate is filled with a material comprising silver. The recess may comprise a contact via formed over a circuit element provided in the semiconductor substrate, for example, a field effect transistor, such that the recess filled with the material comprising silver provides an electric connection to the circuit element.

The material comprising silver may be comprised of substantially pure silver. Advantageously, the use of substantially pure silver may help provide a very low resistivity of the material. In other embodiments, the material comprising silver may be comprised of an alloy comprising silver, for example silver alloyed (0-10%) with other noble metals, such as rhodium, iridium, platinum, ruthenium and gold. Alloys comprising other metals, such as copper, aluminum, chromium and tantalum may also be used. In further embodiments, alloys comprising bismuth, boron, phosphorous, silicon, carbon and sulfur may be used. Advantageously, bismuth, boron, phosphorous, silicon, carbon and sulfur may provide a grain boundary fix.

Furthermore, in some embodiments, a layer of a material comprising rhodium may be provided below and/or above the material comprising silver. The layer of the material comprising rhodium may protect the material comprising silver mechanically and/or chemically.

Advantageously, the material comprising silver may have a high electric conductivity. The electric conductivity of silver is greater than the electric conductivity of tungsten, and even greater than the electric conductivity of copper, which is frequently used for electrical connections in higher interconnect levels. Thus, a resistance of electric connections to circuit elements formed in a semiconductor substrate may be reduced, which may entail a reduction of signal propagation delays and a reduction of the creation of heat in the semiconductor structure.

Furthermore, the material comprising silver may exhibit a softer behavior than tungsten, and may even exhibit a softer behavior than copper. Thus, creation of mechanical stress in the semiconductor structure during annealing processes may be reduced and crystallization of the material comprising silver may be improved.

Moreover, a chemical reaction between the material comprising silver and silicon present in the circuit element below the recess may be initiated. In the chemical reaction, a silicide comprising a chemical compound between silver and silicon may be formed. This may help reduce the contact resistivity between the material comprising silver and the circuit element.

Figure 2A:
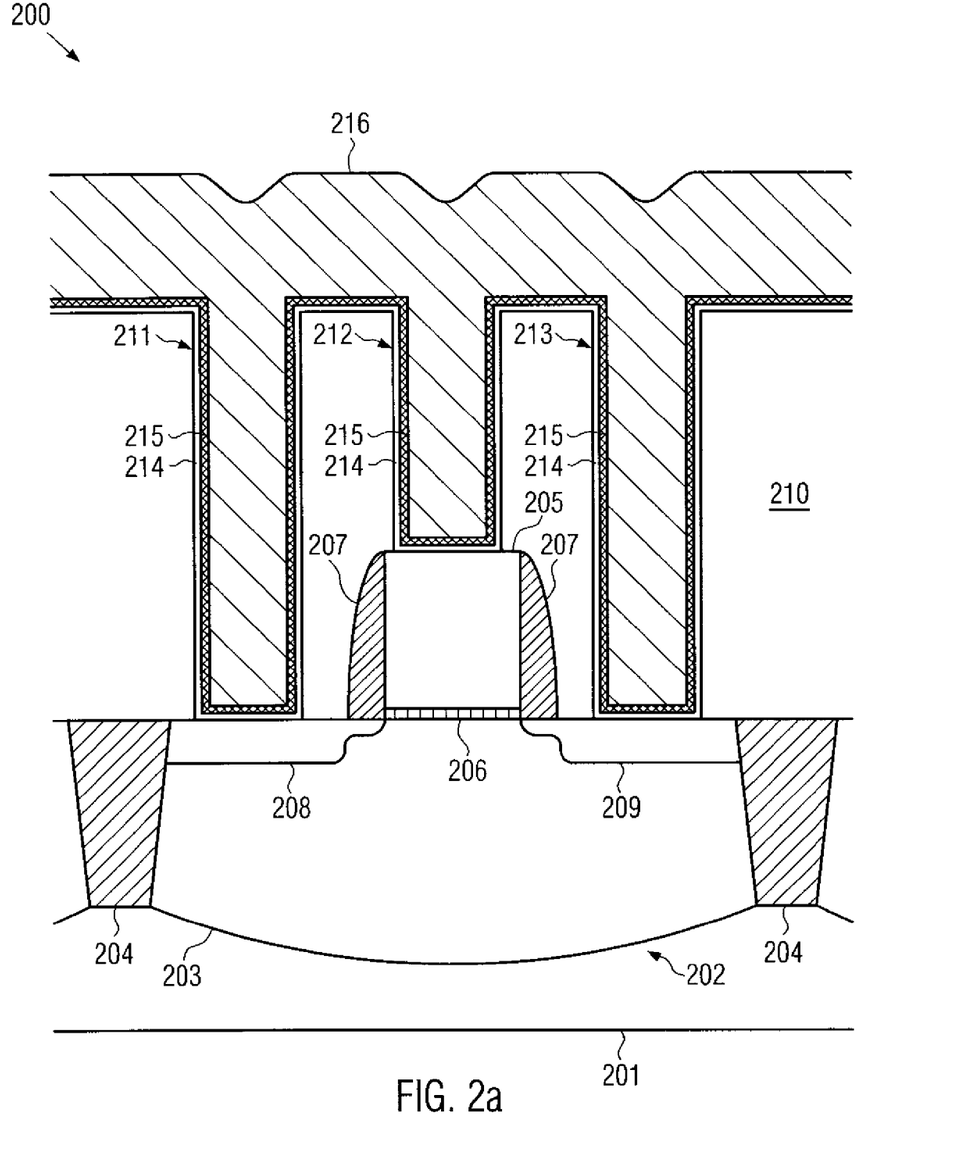
FIGS. 2a-2c show schematic cross-sectional views of a semiconductor structure in stages of a method of manufacturing a semiconductor structure according to an embodiment disclosed herein.

FIG. 2a shows a schematic cross-sectional view of a semiconductor structure 200 in a first stage of a method of forming a semiconductor structure according to an illustrative embodiment disclosed herein. The semiconductor structure 200 comprises a substrate 201 comprising a circuit element provided in the form of a field effect transistor 202. The substrate 201 may comprise a semiconductor material, for example, silicon. The field effect transistor 202 comprises an active region 203 formed in the substrate 201. A gate electrode 205 is formed over the active region 203 and is separated therefrom by a gate insulation layer 206. In some embodiments, the gate electrode 205 may comprise polycrystalline silicon and the gate insulation layer 206 may comprise silicon dioxide, silicon nitride and/or silicon oxynitride. The gate electrode 205 is flanked by a sidewall spacer structure 207. Adjacent the gate electrode 205, a source region 208 and a drain region 209 are formed. A trench isolation structure 204 provides electrical isolation between the field effect transistor 202 and other circuit elements formed in the substrate 201.

The field effect transistor 202 and the trench isolation structure 204 may be formed by means of methods of photolithography, etching, deposition, ion implantation and annealing well known to persons skilled in the art.

A layer 210 comprising a dielectric material, for example, silicon dioxide or silicon nitride, is formed over the substrate 201. To this end, deposition techniques well known to persons skilled in the art, such as CVD and/or PECVD, may be employed. A thickness of the layer 210 of dielectric material may be greater than a height of the gate electrode 205. After the formation of the layer 210 of dielectric material, a planarization process, for example, a CMP process, may be performed in order to reduce a roughness of a surface of the layer 210 of dielectric material.

Recesses provided in the form of contact vias 211, 212, 213 are formed in the layer 210 of dielectric material. The contact via 211 is formed over the source region 208. The contact via 212 is formed over the gate electrode 205 and the contact via 213 is formed over the drain region 209. Thus, a portion of the source region 208 is exposed at the bottom of the contact via 211, a portion of the gate electrode 205 is exposed at the bottom of the contact via 212 and a portion of the drain region 209 is exposed at the bottom of the contact via 213. Similar to the method of manufacturing a semiconductor structure according to the state of the art described above with reference to FIGS. 1a-1b, the contact vias 211, 212, 213 may be formed by forming a mask (not shown) having openings at the locations at which the contact vias 211, 212, 213 are to be formed and exposing the semiconductor structure 200 to an etchant adapted to remove the material of the layer 210.

A layer 214 of a material comprising rhodium is formed over the semiconductor structure 100. The layer 214 of material comprising rhodium may cover the bottom surfaces and sidewalls of the contact vias 211, 212, 213, as well as portions of the surface of the layer 210 outside the contact vias 211, 212, 213, such as portions of the surface of the layer 210 between the contact vias 211, 212, 213. At the bottom surfaces of the contact vias 211, 212, 213, the layer 214 may be located on the source region 210, the gate electrode 205 and the drain region 209, respectively.

In some embodiments, the layer 214 of material comprising rhodium may be formed by means of a sputtering process. In the sputtering process, a target comprising rhodium is irradiated with ions, for example, ions of a noble gas such as argon. Due to the impact of the ions, rhodium atoms are knocked out of the target. The semiconductor structure 200 is provided opposite the target such that at least a portion of the rhodium atoms knocked out of the target impinges on the semiconductor structure 200 to form the layer 214.

In other embodiments, the layer 214 of the material comprising rhodium may be formed by means of an ALD process. In the ALD process, the semiconductor structure 200 is provided in a reactor vessel to which gaseous precursors may be supplied. Then, a first precursor comprising rhodium, for example, rhodium(III) acetylacetonate, is supplied to the reactor vessel. Thus, a substantially monoatomic layer of the first precursor is formed over the semiconductor structure 100. Parameters of the deposition process, such as the temperature of the semiconductor structure 200 and/or a flow of the first precursor, are adapted such that the substantially monoatomic layer of the first precursor remains on the surface of the semiconductor structure 100, but further molecules of the first precursor may not be substantially stably bound to the substantially monoatomic layer of the first precursor. In one embodiment, the ALD process may be performed at a temperature in a range from approximately 100-400° C. Performing the ALD process in this temperature range may help avoid damaging silicide portions provided in the field effect transistor 202. As is well known to persons skilled in the art, such silicide portions may, for example, be provided in the source region 208 and the drain region 209.

Thereafter, a second precursor, for example oxygen, is supplied to the reactor vessel. The second precursor is adapted to react chemically with the first precursor. In the chemical reaction, rhodium and other volatile reaction products may be formed. While the rhodium remains on the surface of the semiconductor structure 200 to form the layer 214, the volatile reaction products can be pumped out of the reactor vessel by means of a vacuum pump.

Subsequently, the alternate supply of the first and the second precursor is repeated, until the layer 214 has reached a desired thickness. Since the growth rate of the layer 214 is substantially limited by the amount of the first precursor which can be deposited in one cycle, i.e., substantially one monoatomic layer, a thickness of the layer 214 of material comprising rhodium may be substantially independent of the inclination of the portion of the surface of the semiconductor structure 200 on which it is formed. In particular, a thickness of the layer 214 of the material comprising rhodium on the bottom surfaces and sidewalls of the contact vias 211, 212, 213 may be substantially equal to a thickness of the layer 214 over substantially horizontal portions of the semiconductor structure 200 outside the contact vias 211, 212, 213, for example over portions of the layer 210 of dielectric material between the contact vias 211, 212, 213 and the bottom surface of the contact vias 211, 212, 213. In further embodiments, other methods may be used for the formation of the layer 214 of material comprising rhodium. For example, the layer 214 may be formed by means of a CVD process and/or a PECVD process. The layer 214 of material comprising rhodium may have a thickness in a range from approximately 5-30 nm, in particular a thickness in a range from approximately 5-10 nm.

After the formation of the layer 214 of material comprising rhodium, a seed layer 215 comprising silver is formed over the semiconductor structure 200. In some embodiments, the seed layer 215 may be formed by means of a CVD process wherein a reactant, for example a metal organic compound comprising silver, such as (1,1,1,5,5,5-Hexafluoro-2,4-pentanedionato)-silver[bis(trimethylsilyl)acetylene] or volatile metal acetamidinates, [M(RNC(CH3)NR)x]y, is supplied to a reactor vessel wherein the semiconductor structure 200 is provided. At the surface of the semiconductor structure 200, the metal organic compound and, optionally, other reactants supplied to the reaction vessel undergo a chemical reaction wherein elementary silver is formed. The silver is deposited on the semiconductor structure 200 to form the seed layer 215, whereas other reaction products can be pumped out of the reactor vessel.

In other embodiments, a PECVD process may be employed to form the seed layer 215. As persons skilled in the art know, PECVD is a variant of CVD wherein a glow discharge is created in the reactant gas. To this end, a radio frequency alternating voltage and, optionally, a bias voltage are applied between the semiconductor structure 200 and an electrode provided in the reactor vessel. Alternatively, the radio frequency alternating voltage and/or the bias voltage can be applied between a first and a second electrode, wherein one of the electrodes is provided in the vicinity of the semiconductor structure 200. The bias voltage can be a direct voltage or a low frequency alternating voltage. In the glow discharge, chemically reactive species, such as atoms, ions and/or radicals, are created from the reactant gas. Therefore, chemical reactions in the reactant gas wherein elementary silver deposited on the surface of the semiconductor structure 200 is formed may occur at a lower temperature than in a CVD process wherein no glow discharge is created in the reactant gas. Advantageously, this may reduce the thermal budget of the semiconductor structure 200 during the formation of the seed layer 215.

In further embodiments, the seed layer 215 may be formed by means of an electroless deposition process. In the electroless deposition process, the semiconductor structure 200 is inserted into a solution comprising a compound comprising silver, such as $AgNO_3$ or Ag sulfates. In some embodiments, compounds comprising organic sulfates may be used. Additionally, the solution may comprise inhibitors, levelers and accelerators similar to those employed in copper plating which are well known to persons skilled in the art. The solution may further comprise a solvent. The solvent may comprise water. In other embodiments, an organic solvent or super-critical carbon dioxide may be used. At the surface of the semiconductor structure 200, a chemical reaction wherein elementary silver is created occurs. The elementary silver is deposited on the semiconductor structure 200 to form the seed layer 215.

After the formation of the seed layer 215, a layer 216 of a material comprising silver is deposited over the semiconductor structure 200. The layer 216 may be comprised of substantially pure silver. In other embodiments, the layer 216 may comprise a silver alloy.

In some embodiments, the layer 216 of the material comprising silver may be formed by means of an electroplating process. In electroplating, the semiconductor structure 200 and an electrode comprised of the material comprising silver are inserted into an electrolyte. The electrolyte may comprise an aqueous solution of a silver salt, for example $AgNO_3$ or Ag sulfates. In some embodiments, organic sulfates may be used. In embodiments wherein the layer 216 is comprised of substantially pure silver, the electrode may also be comprised of substantially pure silver. In other embodiments wherein the layer 216 comprises a silver alloy, the electrode may comprise the silver alloy. In such embodiments, the electrolyte may comprise salts of other components of the material comprising silver in addition to a silver salt.

An electric voltage is applied between the semiconductor structure 200 and the electrode. A polarity of the electric voltage is such that, at least on average, the semiconductor structure 200 becomes a cathode and the electrode becomes an anode. Thus, at the semiconductor structure 200, silver ions and, optionally, other positively charged ions from the electrolyte change into the solid state and form the layer 216 of material comprising silver. At the electrode, silver atoms and, optionally, atoms of one or more other elements, are electrically charged and change in a solved state in the electrolyte.

In other embodiments, the layer 216 of the material comprising silver may be formed by means of a CVD process and/or a PECVD process. In such embodiments, the layer 216 and the seed layer 215 may be formed in a single CVD process or PECVD process and need not be distinct from each other.

After the formation of the layer 216 of material comprising silver, an annealing process may be performed. In the annealing process, the semiconductor structure 200 may be exposed to an elevated temperature in a range from about 100-400° C. for a predetermined time in a range from about 1 minute to about 2 hours. In the annealing process, a grain size of the material comprising silver may be increased and voids which may have been formed during the formation of the layer 216 of material comprising silver may be closed. Thus, an electrical conductivity of the material comprising silver may be improved. Advantageously, the increase of the grain size and the closure of voids during the annealing process may be more efficiently performed than in the method according to the state of the art described above with reference to FIGS. 1a-1b wherein contact vias are filled with tungsten.

Figure 2B:
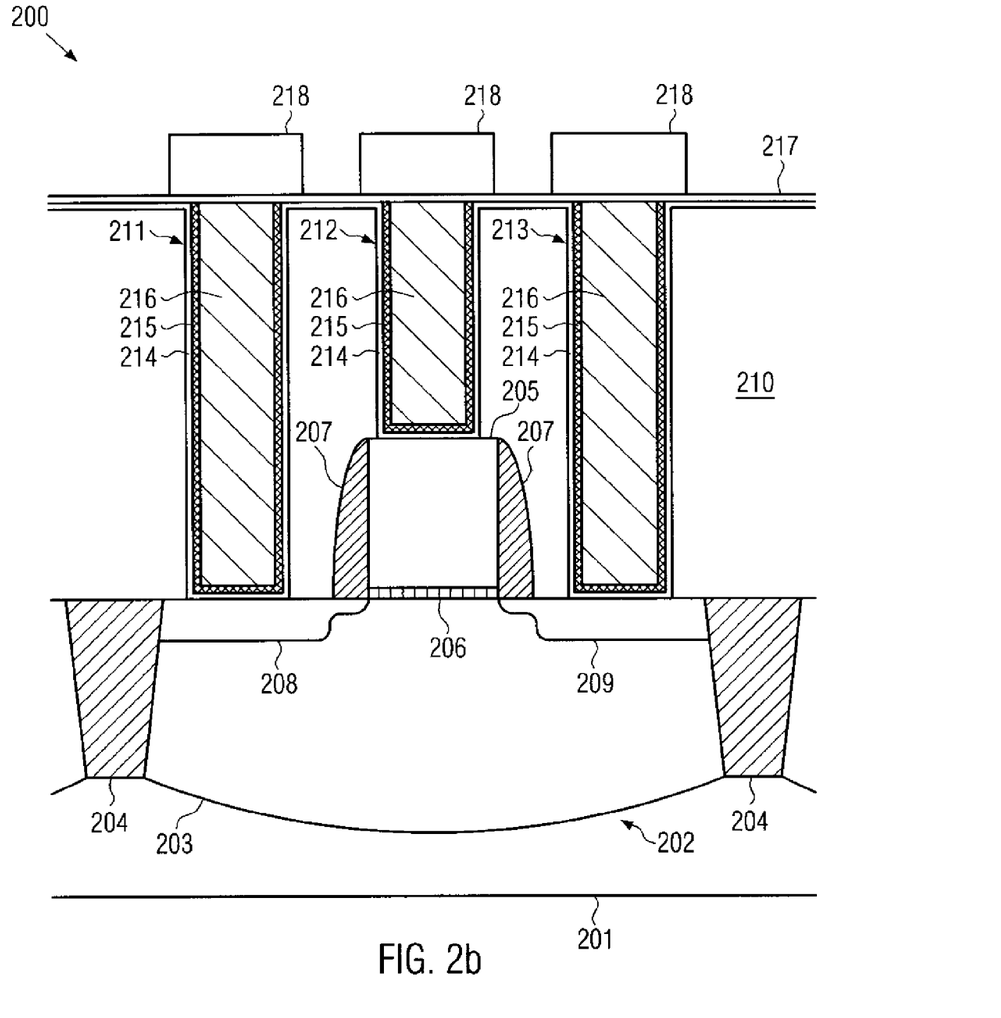

FIG. 2b shows a schematic cross-sectional view of the semiconductor structure 200 in a later stage of the method. After the formation of the layer 216 of material comprising silver, a planarization process may be performed in order to remove portions of the layer 216 outside the contact vias 211, 212, 213. The planarization process may be a CMP process wherein the semiconductor structure 200 is moved relative to a polishing pad, wherein the polishing pad contacts the layer 216. A slurry is supplied to an interface between the semiconductor structure 200 and the polishing pad. The slurry comprises one or more chemical compounds which are adapted to chemically react with the materials on the surface of the semiconductor structure 200. In particular, the slurry may be adapted to react chemically with the material comprising silver of the layer 216. Products of the chemical reaction are removed by means of abrasives contained in the slurry and/or the polishing pad.

The CMP process may be stopped as soon as the layer 214 of the material comprising rhodium is exposed on the surface of the semiconductor structure 200. The layer 214 of the material comprising rhodium need not be removed in the CMP process. Advantageously, this may help reduce the risk of damages of the portions of the layer 216 of material comprising silver located inside the contact vias 211, 212, 213, which might occur if the layer 214 of the material comprising rhodium would also be removed in the CMP process.

A layer 217 of a material comprising rhodium may be deposited on the semiconductor structure 200. The layer 217 may be comprised of the same material as the layer 214. In particular, both the layer 214 and the layer 217 may comprise pure rhodium.

The layer 217 of material comprising rhodium may be formed by means of an electroplating process wherein the semiconductor structure 200 is inserted into an electrolyte comprising a rhodium salt, for example, rhodium sulfate. In addition to the semiconductor structure 200, an electrode comprising rhodium is provided in the electrolyte. A voltage is applied between the semiconductor structure 200 and the electrode. A polarity of the voltage is such that, at least on average, the semiconductor structure 200 becomes a cathode and the electrode becomes an anode. Thus, at the semiconductor structure 200, rhodium ions from the electrolyte are neutralized and change from the solved state into the solid state to form the layer 217 of material comprising rhodium. At the electrode, rhodium atoms are ionized and change from the solid state in the electrode into the solved state in the electrolyte. In other embodiments, sputtering, ALD, CVD and/or PECVD may be employed in the formation of the layer 217 of material comprising rhodium, similar to the formation of the layer 214 described above. The layer 217 may have a thickness in a range from about 5-30 nm, in particular a thickness in a range from about 5-10 nm.

After the formation of the layer 217 of material comprising rhodium, a mask 218 may be formed over the semiconductor structure 200. The mask covers the contact vias 211, 212, 213. The mask 218 may comprise a photoresist and may be formed by means of a photolithographic process of a type well known to persons skilled in the art.

An etching process adapted to remove the material comprising rhodium of the layers 214, 217, leaving the mask 218 and the layer 210 of dielectric material substantially intact is performed. In some embodiments, the etching process may be a dry etching process. In dry etching, a glow discharge is created in an etching gas which may, for example, comprise fluorine or a chemical compound comprising fluorine. The glow discharge may be created by applying a high frequency alternating voltage and/or a bias voltage which may be a low frequency alternating voltage or a direct voltage between the semiconductor structure 200 and an electrode provided in the vicinity of the semiconductor structure 200. Alternatively, the high frequency alternating voltage and the bias voltage may be applied between a first and a second electrode, wherein one of the electrodes is provided in the vicinity of the semiconductor structure 200. In the glow discharge, chemically reactive species, such as atoms, radicals and/or ions, are created from the etching gas. The chemically reactive species may react chemically with the material comprising rhodium in the layers 214, 217, creating a volatile reaction product. The volatile reaction products may be pumped out of a reactor vessel wherein the etching process is performed. In particular, volatile chemical compounds comprising rhodium and fluorine may be created from the rhodium in the layers 214, 217.

In other embodiments, portions of the layers 214, 217 not covered by the mask 218 may be removed by means of a wet chemical etching process, wherein the semiconductor structure 200 is exposed to a solution of a chemical compound reacting chemically with rhodium. For example, the chemical compound may comprise ozone and/or hydrogen chloride, which may be provided in the form of an aqueous solution.

Figure 2C:
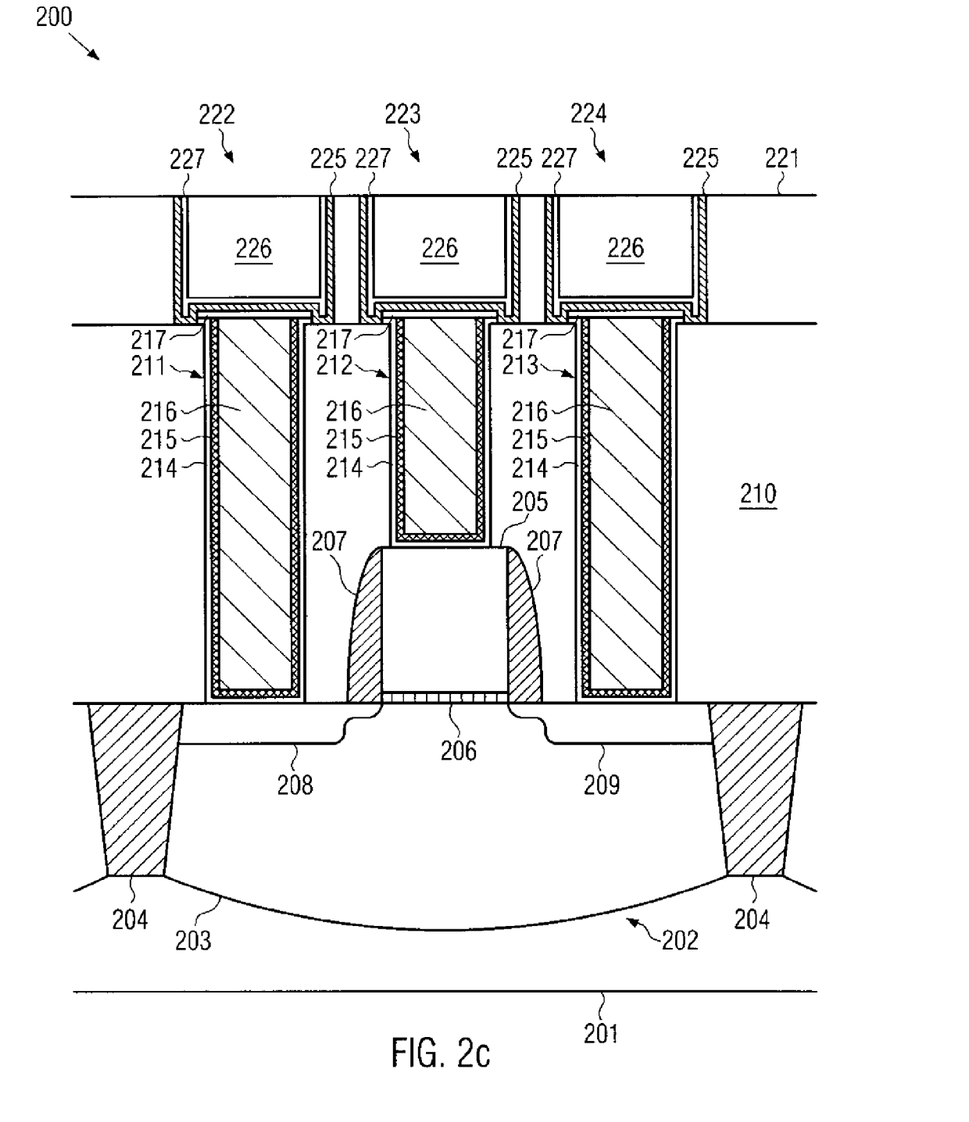

FIG. 2c shows a schematic cross-sectional view of the semiconductor structure 200 in a later stage of the manufacturing process. After the etching process, the mask 218 can be removed, for example, by means of a known resist strip process. After the etching process, substantially an entire interface between the material comprising silver in each of the contact vias 211, 212, 213 is covered by the layers 214, 217 of material comprising rhodium. Thus, the material comprising silver in each of the contact vias 211, 212, 213 is surrounded by a cage of material comprising rhodium formed by portions of the layer 214, 217. The material comprising rhodium may prevent a contact between the silver and the material of the dielectric layer 210, thus protecting the silver both chemically and mechanically. In particular, rhodium has a high chemical stability.

The present invention, however, is not restricted to embodiments wherein the layers 214, 217 of material comprising rhodium form a cage which substantially completely surrounds the material comprising silver provided inside the contact vias 211, 212, 213. In other embodiments, prior to the formation of the seed layer 215, portions of the layer 214 of material comprising rhodium located at the bottom of the contact vias 211, 212, 213 may be removed before the formation of the seed layer 215. This may be done by means of an anisotropic etching process adapted to remove substantially horizontal portions of the layer 214 at the bottom of the contact vias 211, 212, 213 at a higher etch rate than portions of the layer 214 on the sidewalls of the contact vias 211, 212, 213. In such embodiments, the material comprising silver of the seed layer 215 and the layer 216 contacts the silicon of the source region 208, the gate electrode 205 and the drain region 209. In the annealing process performed after the formation of the layer 216, portions of the material comprising silver at the bottom of the contact vias 211, 212, 213 may react chemically with the silicon of the source region 208, the gate electrode 205 and the drain region 209, forming a silver silicide. Advantageously, the formation of the silver silicide may help reduce a contact resistance between the material comprising silver in the contact vias 211, 212, 213 and the source region 208, the gate electrode 205 and the drain region 209.

FIG. 2c shows a schematic cross-sectional view of the semiconductor structure 200 in a later stage of the manufacturing process. Similar to the manufacturing method according to the state of the art described above with reference to FIGS. 1a-1b, a layer 221 of a dielectric material may be formed over the semiconductor structure 200. The layer 221 may comprise the same material as the layer 210, or may comprise a different material. In the formation of the layer 221, deposition processes well known to persons skilled in the art, such as CVD and/or PECVD, may be employed.

In the layer 221, trenches 222, 223, 224 similar to the trenches 122, 123, 124 in the embodiment described above with reference to FIGS. 1a-1b may be formed. For this purpose, methods of photolithography and etching well known to persons skilled in the art may be used. In the trenches 222, 223, 224, a barrier layer 225, a seed layer 227 and a layer 226 of an electrically conductive material may be formed.

In some embodiments, the seed layer 225 and the layer 226 of electrically conductive material may comprise copper. In such embodiments, the barrier layer 225 may comprise tantalum and/or tantalum nitride. The barrier layer 225 may help to prevent or at least reduce a diffusion of copper from the seed layer 227 and/or the layer 226 into the dielectric material of the layer 221 and into other components of the semiconductor structure 200. In particular, the barrier layer 225 may help prevent or reduce a diffusion of copper into the field effect transistor 202, such that a reduction of the performance of the field effect transistor 202 due to deep impurity levels caused by the incorporation of copper atoms into the crystal structure of the semiconductor substrate 201 may be substantially avoided. The seed layer 227 may be formed by electroless plating, CVD and/or PECVD and the layer 226 may be formed by electroplating.

In other embodiments, the seed layer 227 and the layer 226 of electrically conductive material may be comprised of a material comprising silver, wherein substantially pure silver or a silver alloy may be used. In such embodiments, the barrier layer 225 may be comprised of a material comprising rhodium, similar to the layer 214 described above. Similar to the formation of the layer 214, the barrier layer 225 may be formed by means of sputtering, ALD, CVD and/or PECVD. The seed layer 227 may be formed by means of CVD, PECVD and/or electroless deposition, similar to the formation of the seed layer 215 described above. Similar to the deposition of the layer 216 of the material comprising silver, the layer 226 of electrically conductive material when comprised of a material comprising silver may be deposited by means of an electroplating process.

After the formation of the layer 226 of electrically conductive material, a planarization process, for example a CMP process, may be performed in order to remove portions of the layer 226 of electrically conductive material and the seed layer 227 outside the trenches 226. Additionally, in the planarization process, portions of the barrier layer 225 outside the trenches 222, 223, 224 may be removed.

In some embodiments wherein the seed layer 227 and the layer 226 of electrically conductive material comprise silver and the barrier layer 225 comprises rhodium, the barrier layer 225 is not removed in the planarization process. In such embodiments, portions of the barrier layer 225 outside the trenches 222, 223, 224 may be removed by means of an etching process, similar to the etching process described above for the removal of portions of the layer 214 of material comprising rhodium outside the contact vias 211, 212, 213. In some embodiments, a further layer of material comprising rhodium may be formed over the trenches 222, 223, 224, similar to the formation of the layer 217 of material comprising rhodium over the contact vias 211, 212, 213.

After the removal of portions of the layer 226, the seed layer 227 and the layer 226 of electrically conductive material outside the trenches 222, 223, 224, the remaining portions of these layers inside the trenches 222, 223, 224 form electrically conductive lines which may connect the source region 208, the gate electrode 205 and the drain region 209 with other circuit elements in the semiconductor structure 200. Electrical connection between the electrically conductive lines and the source region 208, the gate electrode 205 and the drain region 209 is provided by the material comprising silver provided in the contact vias 211, 212, 213.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:
    providing a semiconductor substrate comprising a first layer of a dielectric material;
    forming a contact via in said first layer of dielectric material, said contact via exposing a portion of a circuit element formed in said semiconductor substrate;
    filling said contact via with a material comprising silver; and
    forming a silicide on said portion of said circuit element, wherein forming said silicide comprises performing an annealing process after filling said contact via with said material comprising silver.

2. The method of claim 1, further comprising forming a layer of a material comprising rhodium over at least one of a sidewall and a bottom surface of said contact via prior to filling said contact via with said material comprising silver.

3. The method of claim 2, wherein said layer of material comprising rhodium is additionally formed over portions of said semiconductor substrate outside said contact via.

4. The method of claim 2, wherein said formation of said layer of material comprising rhodium comprises at least one of atomic layer deposition and sputtering.

5. The method of claim 1, wherein filling said contact via with said material comprising silver comprises depositing a layer of said material comprising silver over portions of said semiconductor substrate outside said contact via.

6. The method of claim 5, wherein said deposition of said material comprising silver comprises at least one of chemical vapor deposition, plasma enhanced chemical vapor deposition and electroplating.

7. The method of claim 5, further comprising removing portions of said layer of material comprising silver located outside said contact via.

8. The method of claim 7, wherein said removing portions of said layer of material comprising silver located outside said contact via comprises performing a chemical mechanical polishing process.

9. The method of claim 3, further comprising removing portions of said layer of material comprising rhodium located outside said contact via.

10. The method of claim 1, further comprising forming a layer of a material comprising rhodium over said semiconductor substrate, said formation of said layer of material comprising rhodium being performed after filling said contact via with said material comprising silver.

11. The method of claim 10, further comprising:
    after said formation of said layer of material comprising rhodium, forming a mask covering said contact via filled with said material comprising silver; and
    performing an etching process adapted to remove portions of said layer of material comprising rhodium which are not covered by said mask.

12. The method of claim 1, further comprising forming an electrically conductive line over said contact via filled with said material comprising silver, said contact via filled with said material comprising silver providing an electrical connection between said electrically conductive line and said circuit element formed in said semiconductor substrate below said contact via.

13. A method of forming a semiconductor structure, comprising:
    forming a field effect transistor above a semiconductor substrate, said field effect transistor comprising a gate electrode structure, a source region, and a drain region;
    forming a dielectric material layer above said field effect transistor;
    forming at least one contact via comprising sidewalls and a bottom surface in said dielectric material layer, said bottom surface of said contact via exposing a portion of at least one of said gate electrode structure, source region, and drain region of said field effect transistor;
    forming a layer of material comprising rhodium over at least one of said sidewalls of said at least one contact via;
    filling said at least one contact via with a material comprising silver; and
    forming a silicide on said portion of at least one of said gate electrode structure, source region and drain region of said field effect transistor, wherein forming said silicide comprises performing an annealing process after filling said at least one contact via with said material comprising silver.

14. The method of claim 13, further comprising forming an electrically conductive line over said at least one contact via filled with said material comprising silver, said at least one contact via providing an electrical connection between said electrically conductive line and at least one of said gate electrode structure, source region, and drain region of said field effect transistor.

15. The method of claim 13, wherein said deposition of said material comprising silver comprises at least one of chemical vapor deposition, plasma enhanced chemical vapor deposition and electroplating.

16. The method of claim 13, wherein said formation of said layer of material comprising rhodium comprises at least one of atomic layer deposition and sputtering.

17. The method of claim 13, wherein a thickness of said dielectric layer is greater than a height of said gate electrode structure of said field effect transistor.

18. The method of claim 17, further comprising planarizing said dielectric material layer prior to forming said at least one contact via.

19. The method of claim 18, wherein planarizing said dielectric material layer comprises performing a chemical mechanical polishing process.

20. The method of claim 13, wherein said material comprising silver is one of substantially pure silver and silver alloyed with a noble metal.

21. The method of claim 2, further comprising removing at least a portion of said layer comprising rhodium from said bottom surface of said contact via prior to filling said contact via with said material comprising silver.

22. The method of claim 12, wherein forming said electrically conductive line comprises:
    forming a trench in a second layer of dielectric material formed above said first layer of dielectric material;
    forming a layer of a material comprising rhodium over at least one of a sidewall and a bottom surface of said trench;
    filling said trench with a material comprising silver.

23. The method of claim 1, wherein said material comprising silver is one of substantially pure silver and silver alloyed with a noble metal.

* * * * *